US007578367B2

(12) United States Patent
Yang et al.

(10) Patent No.: US 7,578,367 B2
(45) Date of Patent: Aug. 25, 2009

(54) SPEAKER SET AND ELECTRONIC PRODUCT INCORPORATING THE SAME

(75) Inventors: Tsung-Lung Yang, Taipei Hsien (TW); Hsien-Sheng Pei, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 223 days.

(21) Appl. No.: 11/683,361

(22) Filed: Mar. 7, 2007

(65) Prior Publication Data

US 2008/0219489 A1 Sep. 11, 2008

(51) Int. Cl.

| | |
|---|---|
| ***H05K 5/02*** | (2006.01) |
| ***H04R 1/28*** | (2006.01) |
| ***H04M 1/03*** | (2006.01) |
| *H05K 5/00* | (2006.01) |
| *H04R 1/22* | (2006.01) |
| *H04M 1/02* | (2006.01) |

(52) U.S. Cl. ........................ 181/145; 181/156; 381/349; 381/351; 379/432; 379/433.02

(58) Field of Classification Search ................. 181/148, 181/145, 156, 160; 381/335, 345, 349, 351, 381/350; 379/431, 432, 433.02
See application file for complete search history.

(56) References Cited

U.S. PATENT DOCUMENTS

| | | | | |
|---|---|---|---|---|
| 4,278,851 | A * | 7/1981 | Takaya | 340/384.6 |
| 4,549,631 | A * | 10/1985 | Bose | 181/155 |
| 4,875,546 | A * | 10/1989 | Krnan | 181/160 |
| 5,092,424 | A * | 3/1992 | Schreiber et al. | 181/145 |
| 5,147,986 | A * | 9/1992 | Cockrum et al. | 181/145 |
| 5,461,672 | A * | 10/1995 | Enokido et al. | 379/433.02 |
| 5,471,019 | A * | 11/1995 | Maire | 181/156 |
| 5,731,553 | A * | 3/1998 | Ledoux | 181/156 |
| 5,790,679 | A * | 8/1998 | Hawker et al. | 381/163 |
| 5,953,414 | A * | 9/1999 | Abraham et al. | 379/433.02 |
| 6,002,949 | A * | 12/1999 | Hawker et al. | 455/569.1 |
| 6,144,738 | A * | 11/2000 | Hawker et al. | 379/433.02 |
| 6,321,070 | B1 * | 11/2001 | Clark et al. | 455/575.1 |
| 6,389,145 | B2 * | 5/2002 | Baumhauer et al. | 381/345 |
| 6,389,146 | B1 * | 5/2002 | Croft, III | 381/345 |
| 6,431,309 | B1 * | 8/2002 | Coffin | 181/156 |
| 6,490,361 | B1 * | 12/2002 | Klein | 381/353 |
| 6,493,456 | B1 * | 12/2002 | Hansson | 384/345 |
| 6,522,759 | B1 * | 2/2003 | Mori | 381/150 |
| 6,526,150 | B2 * | 2/2003 | Kelly et al. | 381/353 |
| 6,553,119 | B1 * | 4/2003 | Mori | 379/433.11 |
| 6,758,303 | B2 * | 7/2004 | Zurek et al. | 181/155 |
| 6,834,744 | B2 * | 12/2004 | Toki | 181/148 |
| 6,876,743 | B2 * | 4/2005 | Asahina et al. | 379/433.02 |
| 6,907,955 | B2 * | 6/2005 | Masuda | 181/148 |
| 6,912,290 | B1 * | 6/2005 | Thorsell et al. | 381/338 |
| 7,136,498 | B1 * | 11/2006 | Schott | 381/351 |

(Continued)

*Primary Examiner*—Edgardo San Martin
(74) *Attorney, Agent, or Firm*—Frank R. Niranjan

(57) ABSTRACT

An electronic product (100) includes a casing (10) containing a speaker set (20) therein. The speaker set includes a hollow shell (60) and a loudspeaker (50). The loudspeaker is accommodated in the shell, dividing an inner space of the shell into a first resonance chamber (61*a*) and a second resonance chamber (61*b*). The loudspeaker includes first tone holes (52) communicating with the first resonance chamber and second tone holes (54) communicating with the second resonance chamber. The first resonance chamber communicates with the second resonance chamber via at least an inverted tube (69).

15 Claims, 8 Drawing Sheets

U.S. PATENT DOCUMENTS

| | | | | |
|---|---|---|---|---|
| 7,346,315 | B2 * | 3/2008 | Zurek et al. | 455/90.3 |
| 7,400,910 | B2 * | 7/2008 | Matsumoto et al. | 455/570 |
| 2002/0051552 | A1 * | 5/2002 | Schott | 381/345 |
| 2002/0061114 | A1 * | 5/2002 | Croft, III | 381/345 |
| 2004/0071303 | A1 * | 4/2004 | Furuya et al. | 381/182 |
| 2005/0168958 | A1 * | 8/2005 | Finney et al. | 361/752 |
| 2005/0190941 | A1 | 9/2005 | Yang | |
| 2005/0233781 | A1 * | 10/2005 | Erixon et al. | 455/575.1 |
| 2007/0154053 | A1 * | 7/2007 | Yang | 381/386 |
| 2007/0242848 | A1 * | 10/2007 | Yang | 381/386 |

* cited by examiner

SPEAKER SET AND ELECTRONIC PRODUCT INCORPORATING THE SAME

CROSS-REFERENCES TO RELATED APPLICATION

This application is related to co-pending U.S. patent application Ser. No. 11/611,709, filed on Dec. 25, 2006, and entitled "SPEAKER SET AND MOBILE PHONE INCORPORATING THE SAME", and co-pending U.S. patent application Ser. No. 11/683,367, entitled "SPEAKER SET FOR ELECTRONIC PRODUCT", and filed on the same date with the present application. The present application and the co-pending applications are assigned to the same assignee. The disclosures of the above-identified applications are incorporated herein by reference.

BACKGROUND OF THE INVENTION

1. Field of the Invention

The present invention relates generally to speaker sets for portable electronic products and, more particularly, to a speaker set for an electronic product, which makes the electronic product compact and produces high quality sound.

2. Description of Related Art

Portable electronic products, such as mobile phones, CD players, MP3s, PDAs (Personal Digital Assistants) and the like, have decreased both in size and weight over the past few years and are becoming ever more popular with travelers. This demand for smaller size with ever-increasing capability has required a tremendous effort to miniaturize many of the components contained within the device.

However, portable electronic products being designed today require multi-media features and provide the user with the same enjoyable experience as that experienced with conventional high quality desktop systems. Thus, the sounds emanating from a portable electronic product should provide as full a harmonic content as is contained in the original sound. The production of low frequency sounds requires a large acoustic chamber for the movement of a large mass of air. As the device is reduced in size, the size of the acoustic chamber of the speaker set and the maximum power the speaker can handle are also accordingly reduced, resulting in both a reduction in loudness as well as a poorer overall quality of sound. However, increasing the device size to increase the size of the acoustic chamber for the speaker is very undesirable since it would strongly detract from the very characteristics that have helped to make these devices popular, namely their size and weight. Thus the size of the device is at odds with sound quality of the speaker.

Therefore, a portable electronic product having compact size and good sound quality is highly needed.

SUMMARY OF THE INVENTION

The present invention relates, in one respect, to an electronic product having compact size and good sound quality, and in another aspect, to a speaker set for the electronic product. According to a preferred embodiment of the present invention, the electronic product includes a casing containing a speaker set therein. The speaker set includes a hollow shell and a loudspeaker. The loudspeaker is accommodated in the shell, dividing an inner space of the shell into a first resonance chamber and a second resonance chamber. The loudspeaker has first tone holes communicating with the first resonance chamber and second tone holes communicating with the second resonance chamber. The first resonance chamber communicates with the second resonance chamber via at least an inverted tube.

Other advantages and novel features of the present invention will become more apparent from the following detailed description of preferred embodiment when taken in conjunction with the accompanying drawings.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
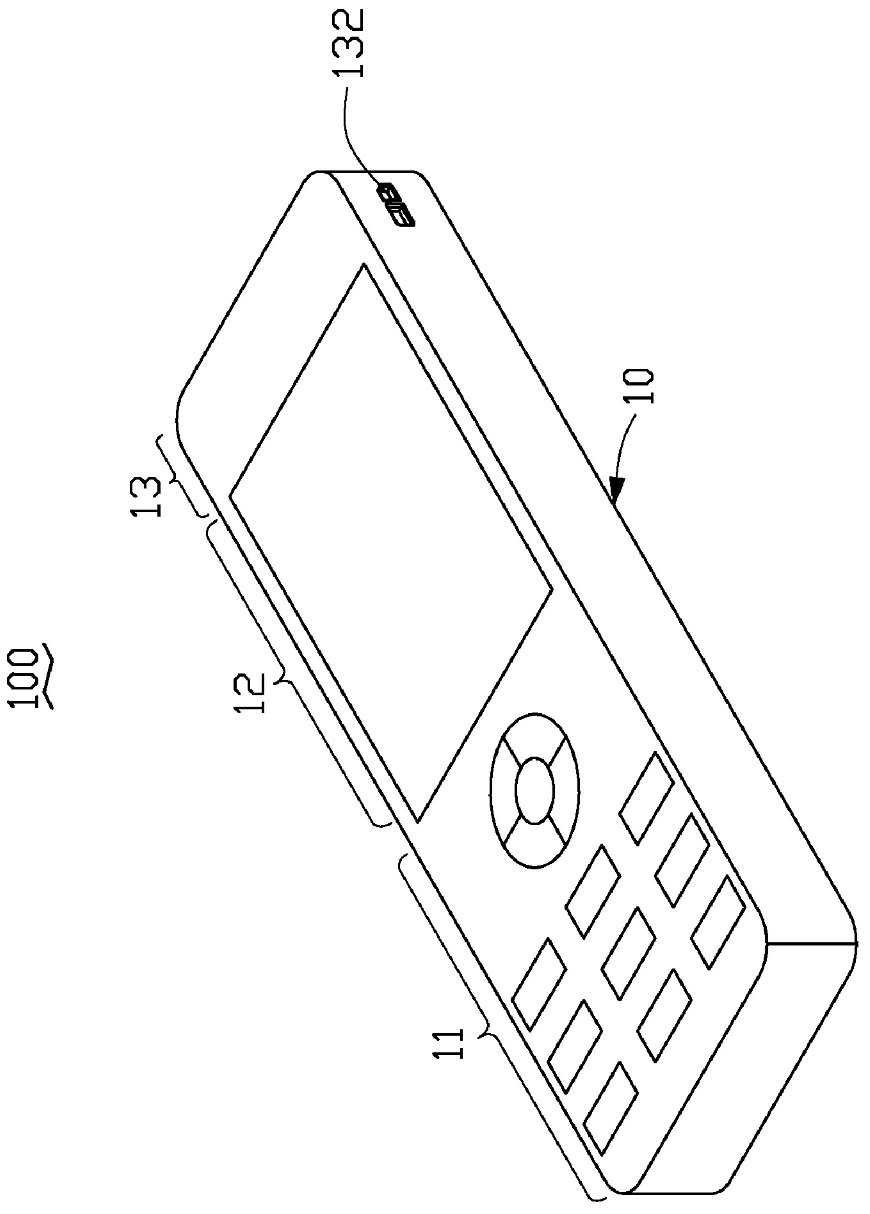
FIG. 1 is an isometric view of a mobile phone according to a first embodiment of the present invention.

Referring to FIG. 1, a mobile phone 100 according to a first embodiment of the present invention is shown. The mobile phone 100 includes a hollow casing 10 and a variety of elements enclosed therein. The casing 10 is substantially rectangular shaped in profile, and includes a keypad 11, a display panel 12, and a speaker section 13 respectively disposed at bottom, middle and top portions of the casing 10. The casing 10 defines a vent hole 132 at one side of the speaker section 13.

Figure 2:
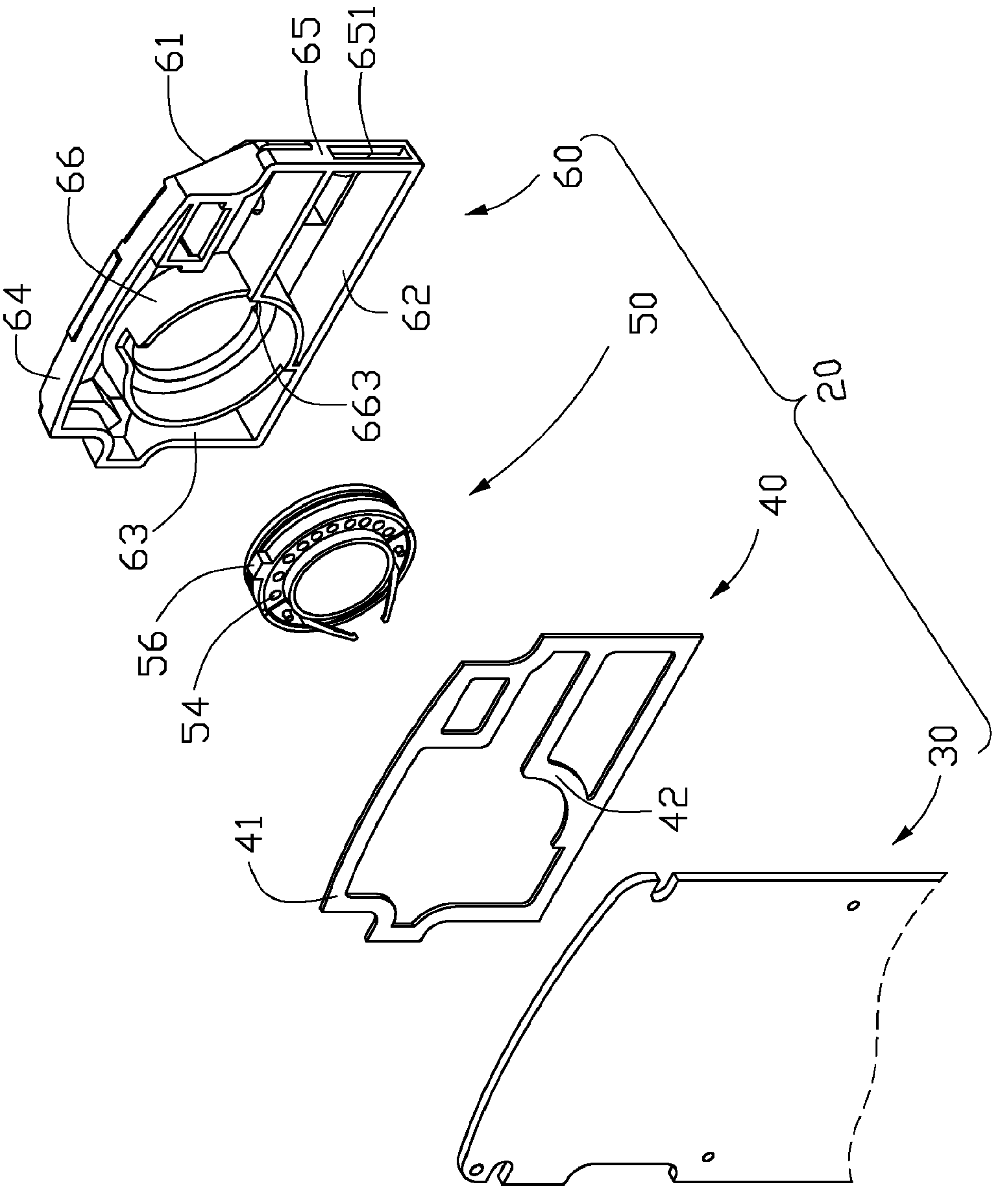
FIG. 2 is an exploded, isometric view of a speaker set of the mobile phone in FIG. 1.
Figure 3:
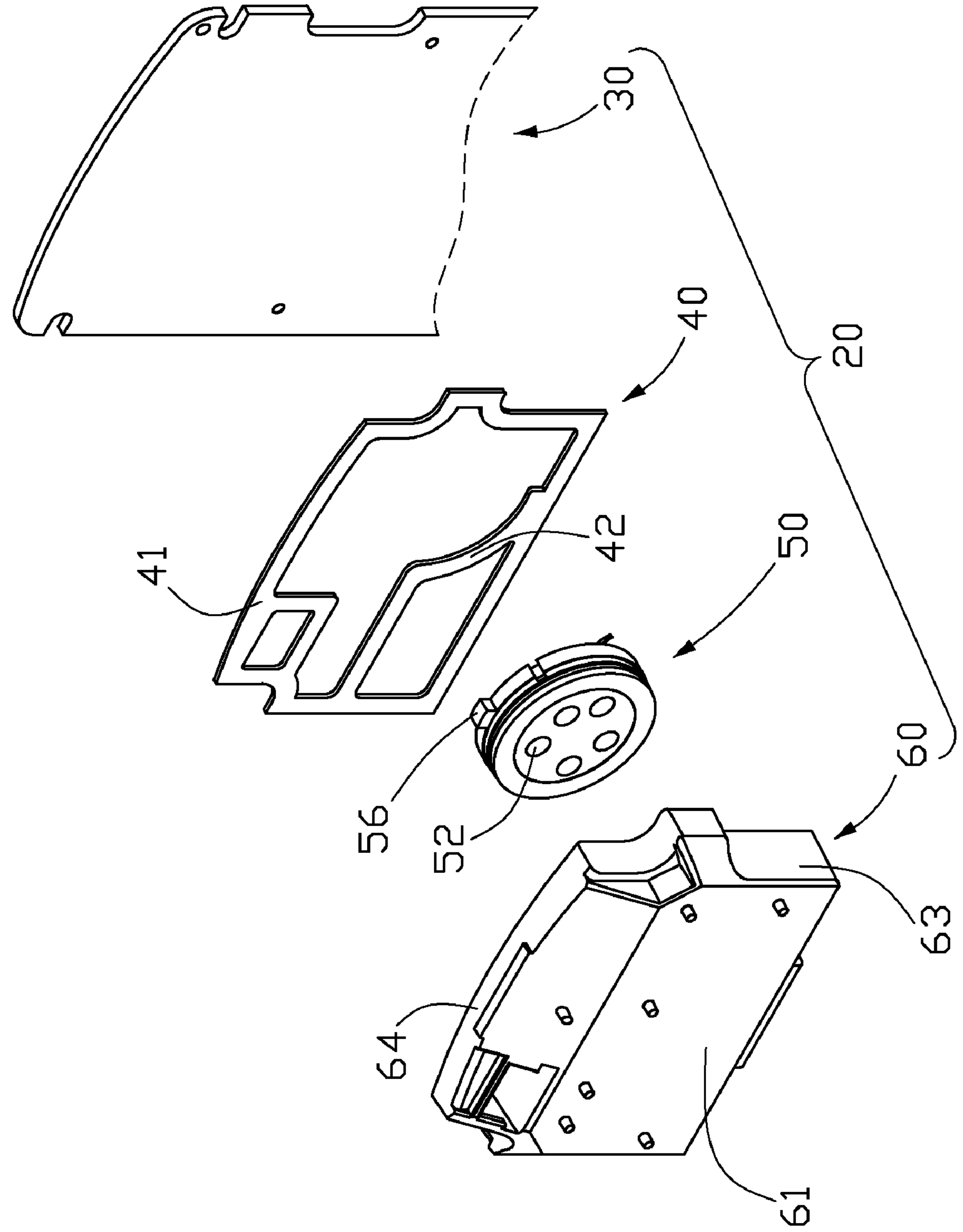
FIG. 3 is similar to FIG. 2, but viewed from another aspect thereof.

Referring to FIGS. 2 and 3, a speaker set 20 is disposed in the speaker section 13 of the casing 10 and includes a printed circuit board 30, a hollow shell 60, a loudspeaker 50 accommodated in the shell 60, and a hollow frame 40 sandwiched between the shell 60 and the printed circuit board 30 of the mobile phone 100.

Figure 4:
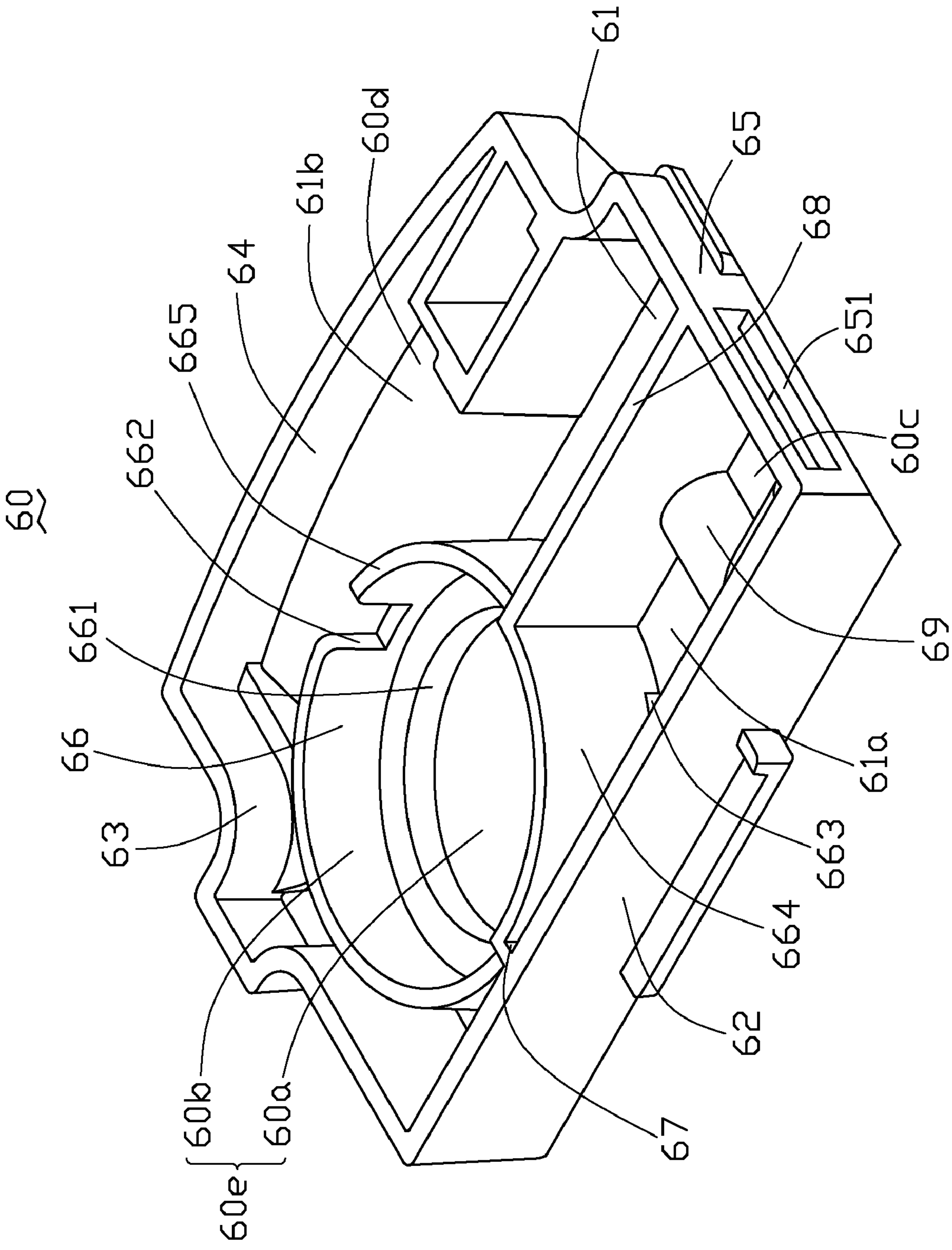
FIG. 4 is an isometric view of a shell of the speaker set of FIG. 2.
Figure 5:
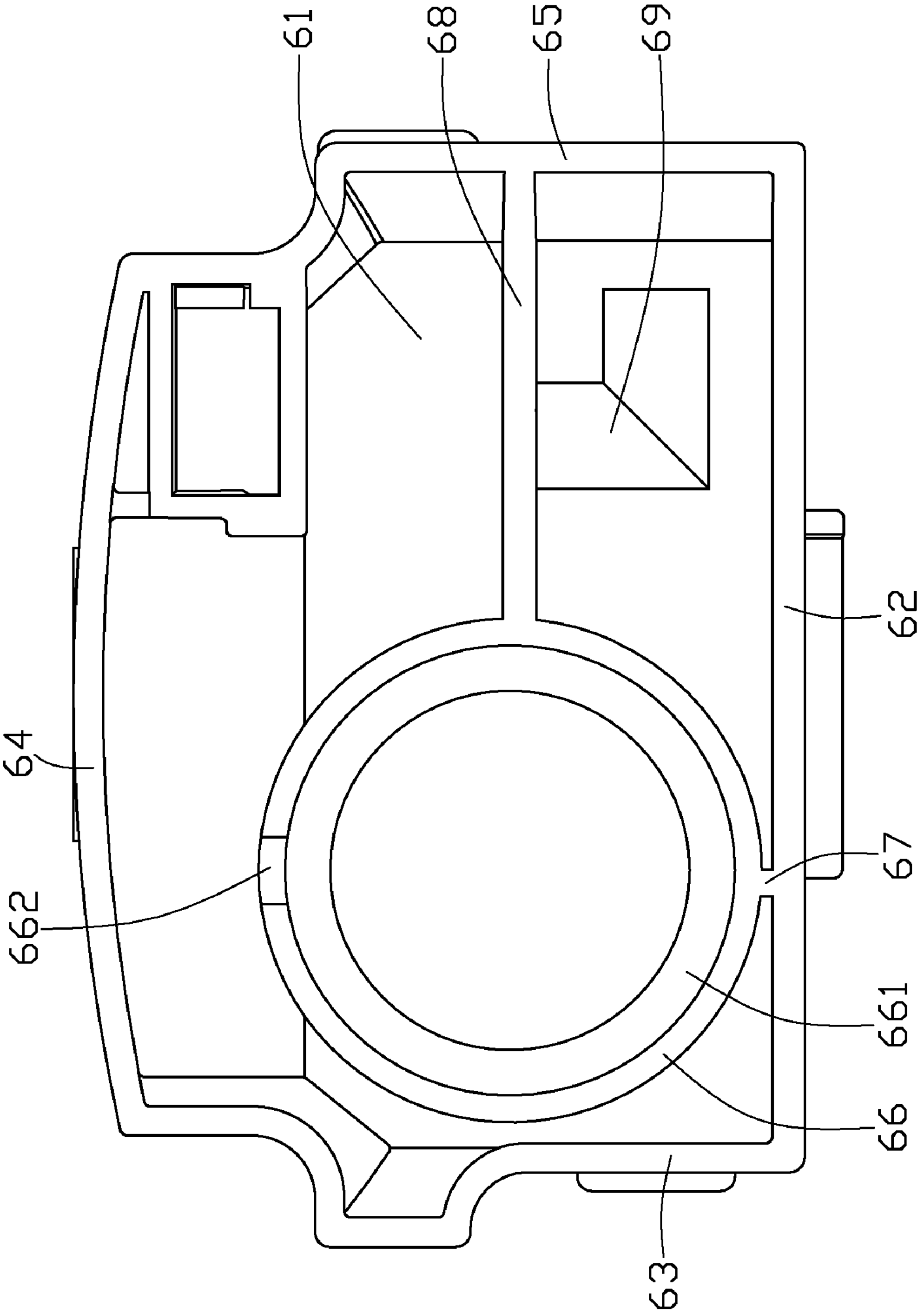
FIG. 5 is a top view of the shell of FIG. 4.

Referring also to FIGS. 4-5, the shell 60 of the speaker set 20 includes a base wall 61 and a plurality of sidewalls 62, 63, 64, 65 perpendicularly extending from a periphery of the base wall 61. The base wall 61 perpendicularly extends an annular wall 66 from a middle portion thereof. The annular wall 66 separates a predetermined distance from the sidewalls 62, 63, 64, 65. The base wall 61 further extends two spacing plates 67, 68 therefrom. The spacing plates 67, 68 connect the annular wall 66 with the corresponding sidewalls 62, 65. The spacing plates 67, 68 are perpendicular to each other, and include a vertical one and a horizontal one above the vertical one. A front surface of each of the spacing plates 67, 68 is coplanar with a front surface of each of the sidewalls 62, 63, 64, 65. The spacing plates 67, 68 and the annular wall 66 cooperatively divide a space formed between the base wall 61 and the sidewalls 62, 63, 64, 65 into three sub-chambers, i.e.

a first chamber 60*e*, a second chamber 60*d* and a third chamber 60*c*. Alternatively, when the annular wall 66 is disposed in contact with the sidewall 62 of the shell 60, the vertical spacing plate 67 can be omitted; with only one (i.e., the horizontal) spacing plate 68 and the annular wall 66 dividing the space formed between the base wall 61 and the sidewalls 62, 63, 64, 65 into the three sub-chambers. A portion of the base wall 61 in the annular wall 66 forms a flange 661 protruding forward in the first chamber 60*e*. The flange 661 is annular and contacts with an inner side of the annular wall 66. The loudspeaker 50 is mounted on the flange 661 and is accommodated in the first chamber 60*e* thus dividing the first chamber 60*e* into two isolated chambers, i.e., a front chamber 60*b* and a rear chamber 60*a*. A front surface of a first edge portion 664 of the annular wall 66 corresponding to the third chamber 60*c* is coplanar with the front surface of each of the sidewalls 62, 63, 64, 65. The first edge portion 664 defines a slot 663 at a bottom thereof so as to communicate the rear chamber 60*a* of the first chamber 60*e* with the third chamber 60*c*. A front surface of a second edge portion 665 of the annular wall 66 corresponding to the second chamber 60*d* is lower than that of the first edge portion 664 of the annular wall 66 so that a height difference is formed therebetween which communicates the front chamber 60*b* of the first chamber 60*e* with the second chamber 60*d*. The second edge portion 665 defines a cutout 662 therein so as to receive an ear 56 (shown in FIG. 2) of the loudspeaker 50 therein, preventing the loudspeaker 50 from rotating in the annular wall 66. The sidewall 65 of the shell 60 defines therein a vent hole 651 communicating with the third chamber 60*c*. The vent hole 651 of the shell 60 communicates with the vent hole 132 of the casing 10 so as to communicate the third chamber 60*c* with the surrounding environment.

The shell 60 of the speaker set 20 further includes an inverted tube 69 disposed in the third chamber 60*c* and communicating the third chamber 60*c* with the second chamber 60*d*. The inverted tube 69 has a semicircular shaped cross section and cooperatively defines an acoustic passage with a top surface of the base wall 61. The inverted tube 69 is L-shaped in profile and has two openings (not labeled) respectively communicating with a hole (not labeled) defined in a bottom of the spacing plate 68 and facing towards the vent hole 651 of the sidewall 65.

Particularly referring to FIGS. 2 and 3, the loudspeaker 50 is column-shaped in profile, and defines a plurality of first tone holes 52 facing towards the rear chamber 60*a* of the first chamber 60*e* and a plurality of second tone holes 54 facing towards the front chamber 60*b* of the first chamber 60*e*. The loudspeaker 50 electrically connects with the printed circuit board 30 so as to receive electrical signals from the printed circuit board 30 and convert the electric signals into acoustic signals. The acoustic signals drive a diaphragm (not shown) of the loudspeaker 50 to oscillate and generate sound waves. The sound waves are transmitted from the loudspeaker 50 via the first and second tone holes 52, 54.

Figure 6:
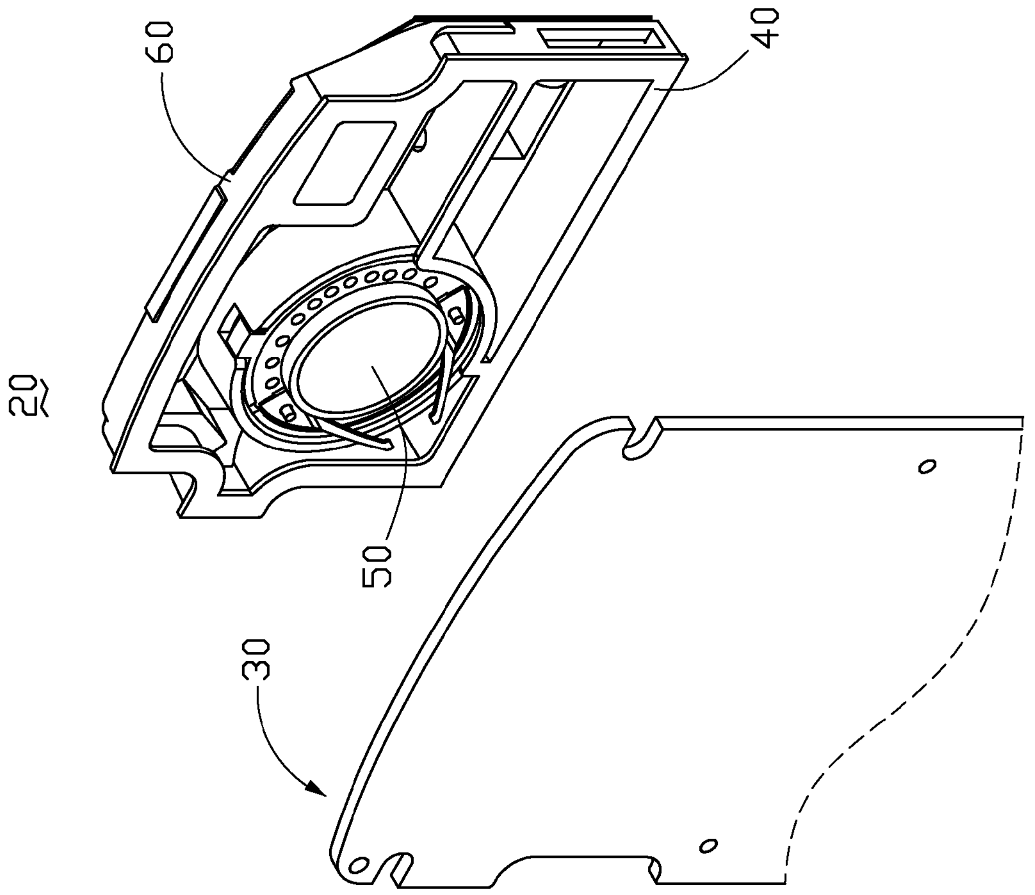
FIG. 6 is a partly assembled view of the speaker set of FIG. 2.

Referring to FIGS. 2-3 and 6, the hollow frame 40 is sandwiched between the front surfaces of the sidewalls 62, 63, 64, 65 of the shell 60 and a rear surface of the printed circuit board 30. The hollow frame 40 is made of vibration-dampening materials such as rubber, or glass fiber cloth. The hollow frame 40 includes an outer frame 41 and an inner frame 42 disposed in the outer frame 41. The outer frame 41 has a similar configuration to the configuration of the shell 60 when viewed from the front. The inner frame 42 has a similar configuration to the configuration of a space enclosed by the spacing plates 67, 68 and the first edge portion 664 of the annular wall 66 when viewed from the front. The hollow frame 40 should preferably be designed to allow a large volume to be enclosed therein without decreasing the vibration-dampening effectiveness thereof.

In assembly of the speaker set 20 in the mobile phone 100, the printed circuit board 30 is disposed in the casing 10 of the mobile phone 100. The loudspeaker 50 is disposed in the annular wall 66 and mounted on the flange 661. The hollow frame 40 is located on an open side (front side) of the shell 60, with rear surfaces of the outer and inner frames 41, 42 contacting with the corresponding front surfaces of the sidewalls 62, 63, 64, 65, of the first edge portion 664 of the annular wall 66 and of the spacing plates 67, 68. The speaker set 20 and the hollow frame 40 are arranged in the casing 10 of the mobile phone 100, with front surfaces of the outer and inner frames 41, 42 contacting with a rear surface of the printed circuit board 30. Therefore, two Helmholtz resonance chambers, i.e., a first resonance chamber 61*a* communicating with the first tone holes 52 of the loudspeaker 50 and consisting of the rear chamber 60*a* and the third chamber 60*c*, and a second resonance chamber 61*b* communicating with the second tone holes 54 of the loudspeaker 50 and consisting of the front chamber 60*b* and the second chamber 60*d*, are formed in the shell 60.

In the assembly of the speaker set 20 in the mobile phone 100, there are adhesives filled in interstices formed between the frame 40 and the printed circuit board 30 and the shell 60 so as to keep a hermetical contact therebetween. Therefore, the sound waves in the second and third chambers 60*d*, 60*c* can not leak from the interstices, and the first resonance chamber 61*a* accordingly communicates with the second resonance chamber 61*b* via the inverted tube 69 only. The sound waves emitted from the first and second tone holes 52, 54 of the loudspeaker 50 are respectively transmitted to and resonate with air in the first and second resonance chambers 61*a*, 61*b* at the natural frequencies thereof. The sound waves in the second resonance chamber 61*b* are then transmitted into the first resonance chamber 61*a* via the inverted tube 69 and further resonate with the air in the first resonance chamber 61*a*. Finally, the sound waves are transmitted to the surrounding environment via the vent holes 651, 132 of sidewall 65 of the shell 60 and the casing 10.

In the present mobile phone 100, the inverted tube 69 inverts phases of the sound waves in the second resonance chamber 61*b* into phases which are coincident with phases of the sound waves in the first resonance chamber 61*a*. Thus, the sound waves transmitted towards the first resonance chamber 61*a* from the second resonance chamber 61*b* are superposed on the sound waves in the first resonance chamber 61*a*, which widens the frequency bandwidth of the sound waves emitted from the shell 60. Accordingly, a crest of a frequency response curve of the sound waves emitting from the shell 60 moves towards a lower frequency as compared to a crest of a frequency response curve of sound waves emitting from the shell 60 without the inverted tube 69 disposed therein. Therefore, the lower frequency range of the sound emitted from the mobile phone 100 is widened and the low-frequency sound emitted from the mobile phone 100 is boosted which increases sound quality of the mobile phone 100. When the acoustic field of the single first and second resonance chambers 61*a*, 61*b* and the shell 60 including the communicated first and second resonance chambers 61*a*, 61 *b* are simulated by using SYSNOISE software distributed by LMS North America, 5455 Corporate Drive, Suite 303, Troy, Mich. 48098, it was found that the response frequency of the singular first resonance chamber 61*a* is about 3000 HZ, the response frequency of the singular second resonance chamber 61*b* is about 6500 HZ, and the response frequency of the shell 60 is about 494 HZ. The response frequency of the shell 60 is responsive to ear, thus allowing high quality sounds to be made by the present mobile phone 100.

In addition, the opening of the inverted tube 69 faces to the vent hole 651 of the sidewall 65. This decreases distance of spread of the sound waves emitted from the inverted tube 69 towards the surrounding environment, which decreases energy loss of the sound waves and therefore increases sound quality of the mobile phone 100. Moreover, the hollow frame 40 weakens the vibration caused by the sound waves transferring towards the printed circuit board 30, which prevents the quality of the sound from being impaired by vibration. The hollow frame 40 has hermetic seal with the printed circuit board 30 and the shell 60 of the speaker set 20, which prevents the sounds from leakage from interstices formed between the printed circuit board 30 and the shell 60 of the speaker set 20.

Figure 7:
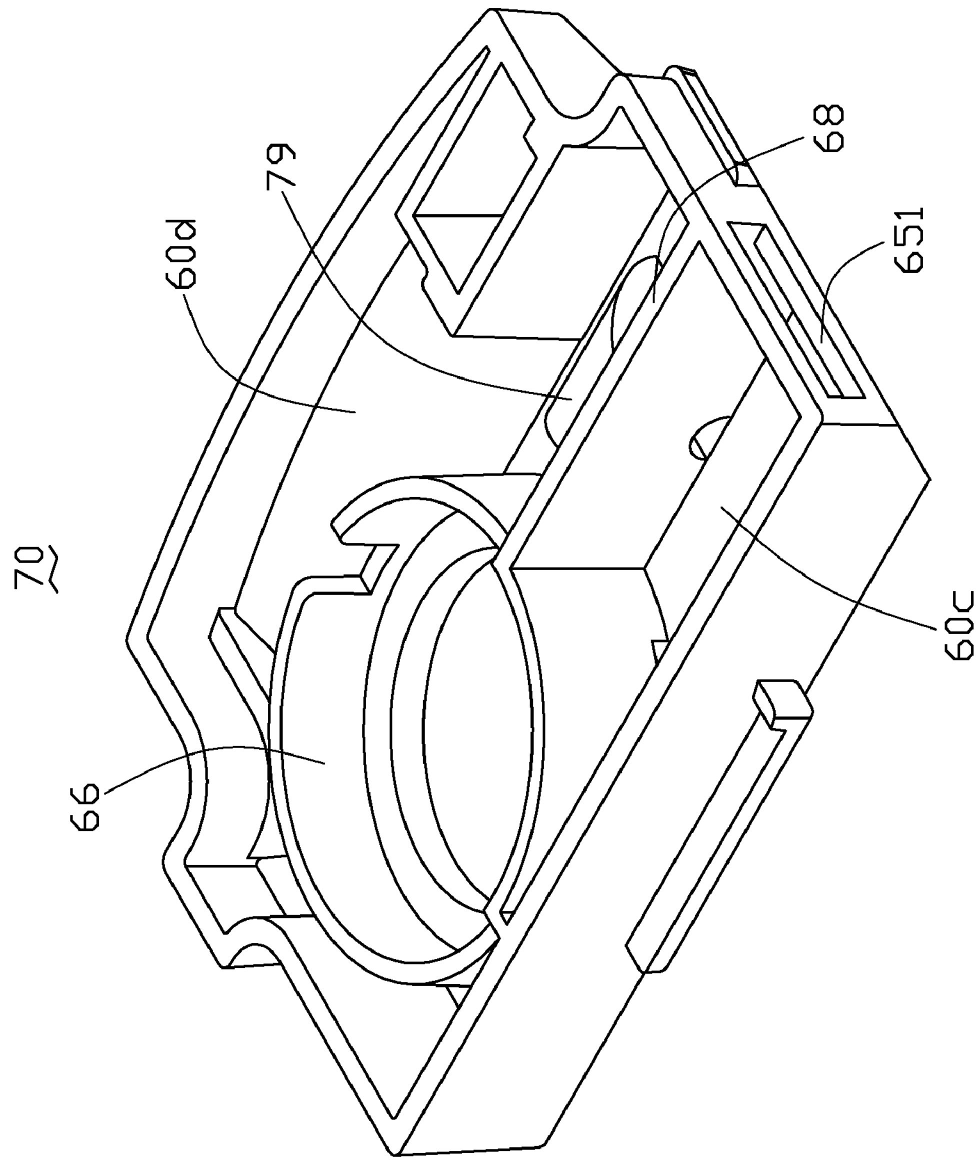
FIG. 7 is an isometric view of a shell of a speaker set according to a second embodiment of the present invention.

Referring to FIG. 7, a second embodiment of a shell 70 of the speaker set 20 of the present mobile phone 100 is shown. The difference between the second embodiment and the first embodiment is: the inverted tube 79 is disposed in the second chamber 60*d* with an opening at a free end thereof facing towards the annular wall 66 of the shell 60. Another opening of the inverted tube 79 at another free end thereof extends through a middle of a bottom of the spacing plate 68 to communicate with the third chamber 60*c*.

Figure 8:
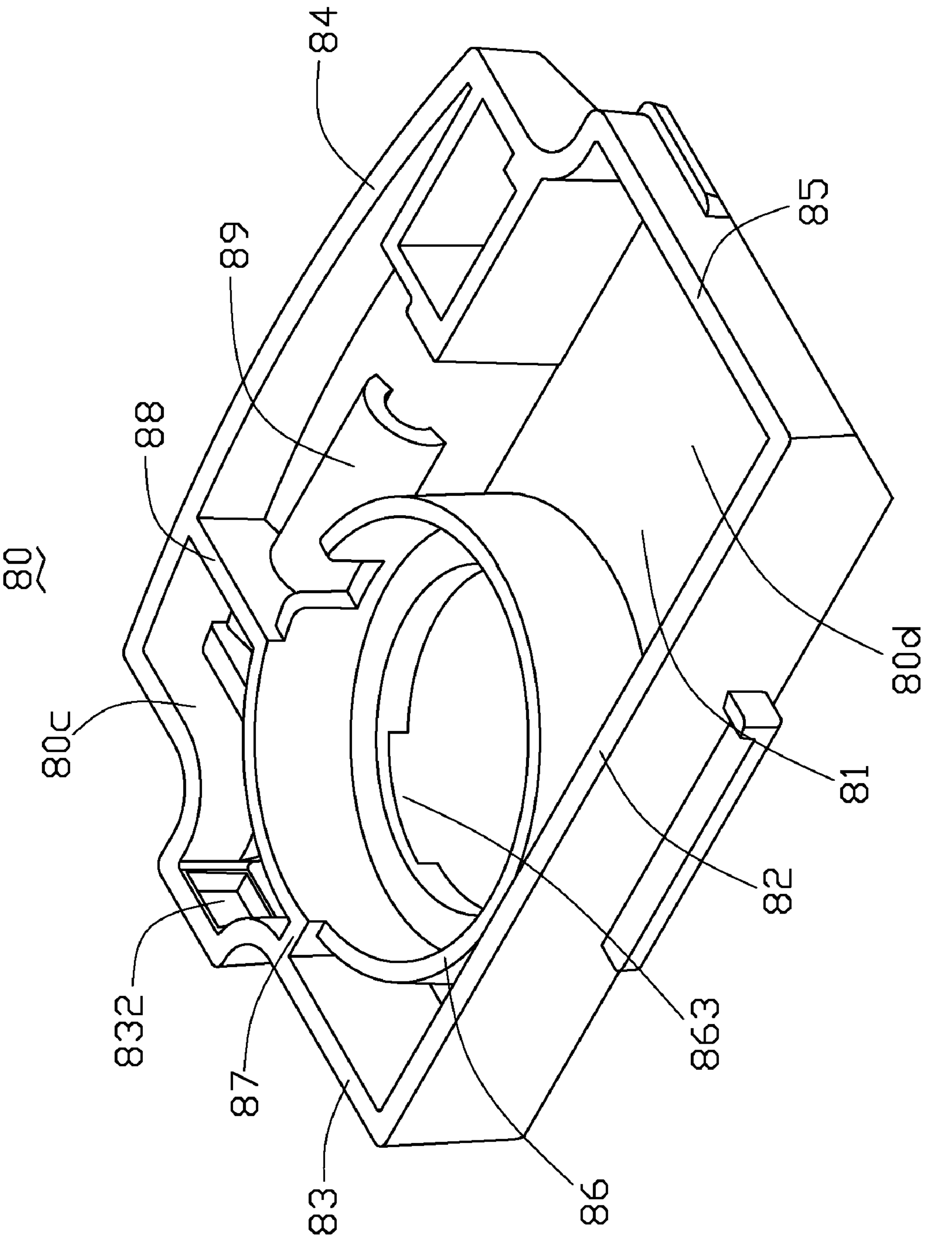
FIG. 8 is an isometric view of a shell of a speaker set according to a third embodiment of the present invention.

Referring to FIG. 8, a third embodiment of a shell 80 of the speaker set 20 of the present mobile phone 100 is shown. In this embodiment, the spacing plates 87, 88 are perpendicular to each other and respectively connect the sidewalls 83, 84 of the shell 80 with the annular wall 86. The second chamber 80*d* is enclosed by the base wall 81, the annular wall 86, the spacing plate 88 and the sidewalls 82, 85, 84, whilst the third chamber 80*c* is enclosed by the base wall 81, the spacing plates 87, 88 and the sidewalls 83, 84. The vent hole 832 of the shell 80 is defined in the sidewall 83 and communicates with the third chamber 80*c*. The inverted tube 89 is linear shaped in profile and is disposed in the second chamber 80*d*. The inverted tube 89 has an opening extending through the spacing plate 88 so that the second chamber 80*d* is communicated with the third chamber 80*c* via the inverted tube 89. A first chamber (not labeled) enclosed by the annular wall 86 is communicated with the third chamber 80*c* via a slot 863 defined in the annular wall 86. The first chamber is provided for receiving the loudspeaker 50 therein.

The present speaker set 20 is disposed in a mobile phone 100. Alternatively, the speaker set 20 is can be used in other kinds of portable electronic products, such as PDAs (personal digital assistants), CD players, MP3s and MP4s. The inverted tube 69/79/89 of the speaker set 20 helps the portable electronic products be compact as well as having good sound quality.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of portions within the principles of the invention to the full extent indicated by the broad general meaning of the terms in which the appended claims are expressed.

What is claimed is:

1. A speaker set configured for an electronic product comprising:

a hollow shell; and a loudspeaker accommodated in the shell, dividing an inner space of the shell into a first resonance chamber and a second resonance chamber, the loudspeaker having first tone holes communicating with the first resonance chamber and second tone holes communicating with the second resonance chamber, the first resonance chamber communicating with the second resonance chamber via at least an inverted tube;

wherein the shell is divided into a first chamber, a second chamber and a third chamber, the loudspeaker being accommodated in the first chamber and dividing the first chamber into a front chamber and a rear chamber, the first resonance chamber consisting of the front chamber and the second chamber, the second resonance chamber consisting of the rear chamber and the third chamber; and wherein the shell comprises a base wall and a plurality of sidewalls surrounding the base wall, the first chamber being enclosed by an annular wall extending from the base wall, the second and third chambers being formed between the base wall, the sidewalls and a periphery of the annular wall, and being isolated from each other by at least a spacing plate disposed between the annular wall and a corresponding sidewall.

2. The speaker set as described in claim 1, wherein the annular wall comprises a first edge portion disposed corresponding to the third chamber and a second edge portion disposed corresponding to the second chamber, the third chamber communicating with the rear chamber of the first chamber via a slot defined at a bottom of the first edge portion, the second chamber communicating with the front chamber of the first chamber via a height difference formed between a front surface of the second edge portion of the annular wall and a front surface of the first edge portion of the annular wall.

3. The speaker set as described in claim 1, wherein the inverted tube is disposed at a bottom of at least one of the second and third chambers and extends through the at least a spacing plate disposed between the second and third chambers.

4. The speaker set as described in claim 1, wherein the inverted tube is L-shaped in profile.

5. The speaker set as described in claim 1, wherein the inverted tube is linear-shaped in profile.

6. The speaker set as described in claim 1, further comprising a hollow frame for being sandwiched between an open side of the shell and a printed circuit board of the electronic product.

7. The speaker set as described in claim 6, wherein the frame is made of vibration-dampening materials.

8. An electronic product comprising:

a casing containing a speaker set therein and defining a vent hole therein, the speaker set comprising:

a printed circuit board;

a hollow shell comprising a first chamber, a second chamber and a third chamber communicating with the second chamber via at least an inverted tube, and defining a vent hole communicating the third chamber with the vent hole of the casing; and a loudspeaker accommodated in the first chamber of the shell and dividing the first chamber into a front chamber and a rear chamber, the front chamber communicating with the second chamber, and the rear chamber communicating with the third chamber;

wherein the shell comprises a base wall and a plurality of sidewalls surrounding the base wall, the first chamber being enclosed by an annular wall extending from the base wall, the second and third chambers being formed between the base wall, the sidewalls and a periphery of the annular wall and being isolated from each other by at least a spacing plate disposed between the annular wall and a corresponding sidewall.

9. The electronic product as claimed in claim 8, wherein the shell further comprises a flange disposed at a bottom of the annular wall in the first chamber, the loudspeaker being mounted on the flange and dividing the first chamber into the front and rear chambers.

10. The electronic product as claimed in claim 8, wherein the annular wall comprises a first edge portion disposed corresponding to the third chamber and a second edge portion disposed corresponding to the second chamber, the third chamber communicating with the rear chamber of the first chamber via a slot defined at a bottom of the first edge portion, the second chamber communicating with the front chamber of the first chamber via a height difference formed between a front surface of the second edge portion of the annular wall and a front surface of the first edge portion of the annular wall.

11. The electronic product as claimed in claim 8, further comprising a hollow frame sandwiched between an open side of the shell and the printed circuit board of the speaker set so as to form a first resonance chamber communicating with first tone holes of the loudspeaker and a second resonance chamber communicating with second tone holes of the loudspeaker, the first resonance chamber communicating with the second resonance chamber via the at least an inverted tube.

12. The electronic product as claimed in claim 11, wherein the frame is made of anti-vibration materials selected from one of rubber and glass fiber cloth.

13. The electronic product as claimed in claim 8, wherein the at least an inverted tube is disposed in the third chamber and having an opening facing to the vent hole of the shell.

14. The electronic product as claimed in claim 8, wherein the at least an inverted tube is L-shaped in profile.

15. The electronic product as claimed in claim 8, wherein the at least an inverted tube is linear-shaped in profile.

* * * * *